United States Patent
McKenzie

(10) Patent No.: US 6,453,398 B1
(45) Date of Patent: Sep. 17, 2002

(54) MULTIPLE ACCESS SELF-TESTING MEMORY

(75) Inventor: Neil R. McKenzie, Arlington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 09/288,098

(22) Filed: Apr. 7, 1999

(51) Int. Cl.[7] .............................................. G06F 12/00
(52) U.S. Cl. ........................ 711/165; 711/105; 711/202
(58) Field of Search .................................. 711/105, 114, 711/206, 165, 168, 104, 202

(56) References Cited

U.S. PATENT DOCUMENTS

| | | | |
|---|---|---|---|
| 5,396,619 A | 3/1995 | Walton | 714/8 |
| 5,440,716 A * | 8/1995 | Schultz et al. | 711/114 |
| 5,537,567 A * | 7/1996 | Galbraith et al. | 711/114 |
| 5,640,509 A | 6/1997 | Balmer et al. | 714/42 |
| 5,661,729 A | 8/1997 | Miyazaki et al. | 714/719 |
| 5,696,923 A * | 12/1997 | Robertson et al. | 711/202 |
| 5,748,543 A | 5/1998 | Lee et al. | 365/200 |
| 5,787,493 A * | 7/1998 | Niijima et al. | 711/204 |
| 5,841,710 A | 11/1998 | Larsen | 365/200 |
| 5,841,784 A | 11/1998 | Chan et al. | 714/718 |
| 5,887,272 A * | 3/1999 | Sartore et al. | 711/105 |
| 5,991,851 A * | 11/1999 | Alwais et al. | 711/106 |

OTHER PUBLICATIONS

D. Patterson et al.; "A Case for Intelligent RAM: IRAM"; IEEE Micro, vol. 17, No. 2, Apr., 1997; p. 34–44.
D. Patterson et al.; "Intelligent RAM (IRAM) : the Industrial Setting, Applications, and Architectures"; ICCD '97 International Conference on Computer Design; Oct. 1997.

* cited by examiner

Primary Examiner—Matthew Kim
Assistant Examiner—Matthew D. Anderson
(74) Attorney, Agent, or Firm—Dirk Brinkman; Andrew J. Curtin

(57) ABSTRACT

A multi-functional general purpose random access memory is fabricated on a single semiconductor substrate. The substrate includes a memory array including a plurality of pages, at least one processing element, and internal-external address mapping means. The pages, processing element, and mapping means are connected to each other by clock, control, data, and address signal lines. The signal lines connect the at least one processing element and the internal-external mapping means to a host processor via an external access path, and signal lines connect the at least one processing element and the memory pages via a multi-function access path, and the signal lines connect the internal-external mapping means to the memory pages via in internal access path.

10 Claims, 3 Drawing Sheets

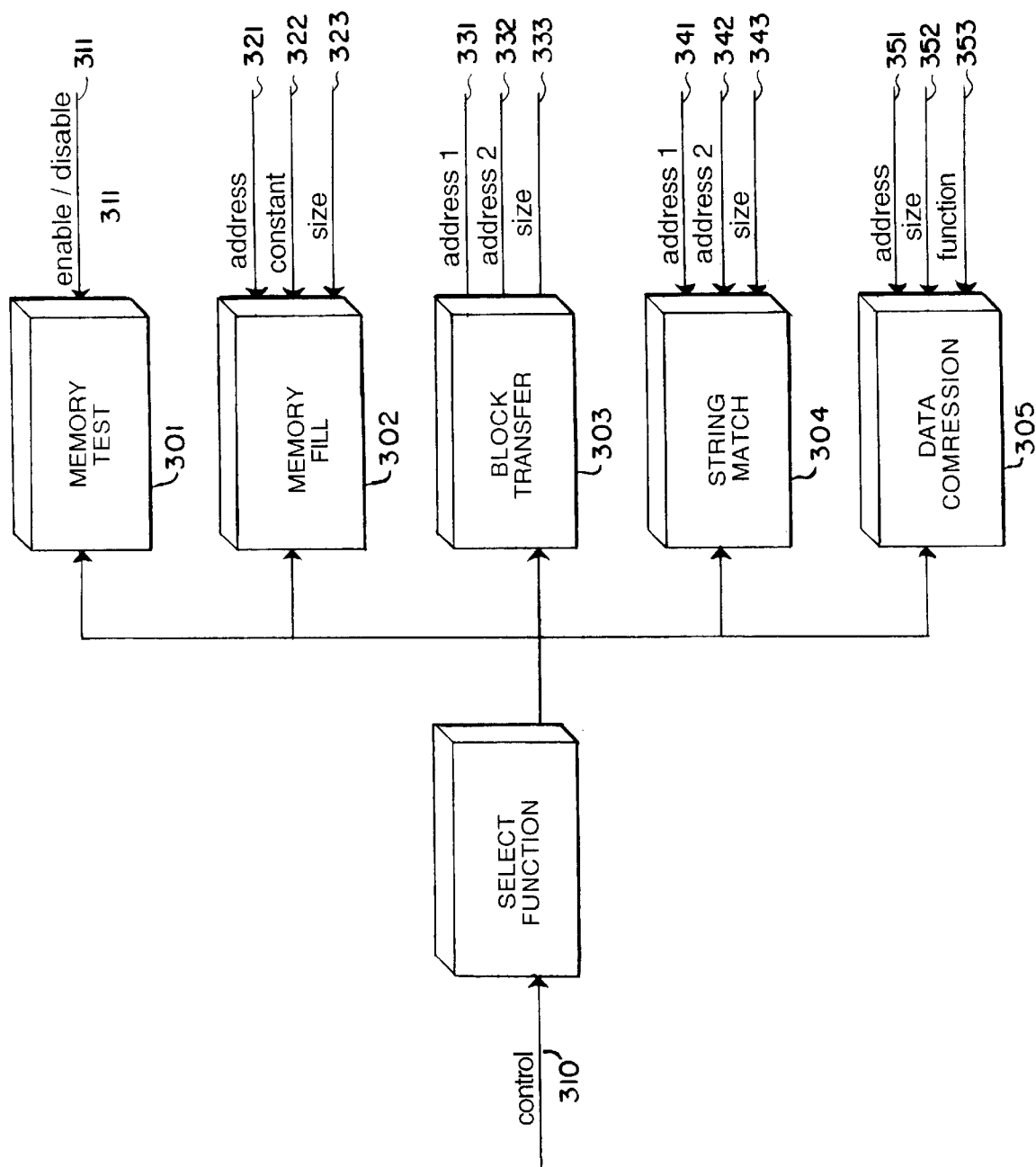

MULTIPLE ACCESS SELF-TESTING MEMORY

FIELD OF THE INVENTION

This invention relates generally to semiconductor memories, and more particularly to memories including logic circuits for functions other than data accessing.

BACKGROUND OF THE INVENTION

Memory performance continues to be a problem in computer systems. Over the last decade, microprocessor performance improvement has been at the rate of 60% per year, while memory access time has improved at less than 10% per year. In part, this is due to the fact that the design criteria for microprocessors and dynamic random access memories (DRAM) are entirely different. For logic circuits, speed is the most important feature, while density and low leakage are the most important features for DRAM. In other words, DRAM designers have focused on improving storage capacity, not speed.

As a consequence, two different processes tend to be used for fabricating semiconductor devices. One process works well for logic circuits, for example, microprocessors, but not for DRAM. The other process works well DRAM, but not for logic. A DRAM fabricated using a process tuned for logic cells would contain relatively few memory cells per unit area. It would also consume much more electrical power than a comparable DRAM fabricated using the memory process. The additional power consumed would be dissipated as heat, and the memory chip would potentially require additional cooling. For these reasons, using a logic process to fabricate a DRAM chip is not cost effective. The logic process is best used in cases where speed is more critical than power dissipation or area efficiency.

Most semiconductor memories provide-only basic memory functionality, that of storing data and allowing its retrieval. Recently, there have been attempts to develop a smart DRAM. A smart DRAM has logic and memory functions fabricated and packaged as a single chip. One such effort is the Berkeley IRAM project described by Patterson et al. in "Intelligent RAM (IRAM): the Industrial Setting, Applications, and Architecture", ICCD '97, International Conference on Computer Design, October 1997, see also http://iram.cs.berkeley.edu. The primary goal of IRAM is to put a powerful processor core onto a memory chip fabricated using a DRAM process. Because IRAM uses a novel (non-standard) vector architecture, there is no software compatibility with the existing base of software. Software compatibility is essential for running existing programs efficiently. Also, the external interface of the IRAM chip differs substantially enough from existing DRAM designs such that it precludes using the IRAM as a standard DRAM.

The M32R/D microcontroller that is available from Mitsubishi Electric Corporation includes 2 MBytes of DRAM. For details, see the "M32000D4AFP User's Manual," available through the Mitsubishi Semiconductor Web site at "www.mitsubishichips.com." The M32R/D is fabricated using a process that is a hybrid between the logic process and the memory process. Like the IRAM, the M32R/D microcontroller has an external interface that is different than that of a standard DRAM chip. By contemporary standards, the M32R contains only a small amount of memory, and probably can be better characterized as a microprocessor with embedded memory than as a smart DRAM.

The 3DRAM Frame Buffer Memory, also from Mitsubishi Electric Corporation, is a high-performance memory used in 3-D graphics frame buffers. See the "M5M410092 Specification, Rev 3.11," published by the Mitsubishi Electric Electronic Device Group. The 3DRAM executes read-modify-write operations on the memory chip itself rather than in the host processor, to accelerate graphics depth-buffer computations. The 3DRAM is an application-specific memory that is tailored for Sun Microsystems graphics workstations, and is not a cost-effective main memory to be used in PCs.

Another design of an enhanced memory is described by Oskin et al. in "Active Pages: A Computation Model for Intelligent Memory," Proceedings of the 25th Annual International Symposium on Computer Architecture, pp. 192–203, June 1998. The Active Page architecture places configurable logic and/or a set of processing elements onto a DRAM memory chip. The logic or processing elements can perform computations in the memory concurrently with programs executing on the host processor. To compensate for implementing logic using the slower DRAM process, the architecture allows for a high degree of parallelism. The Active Page DRAM chip functions much like a scalable parallel processor, and it is most efficient when it is executing software that is already set up to run in parallel. While it is noteworthy to improve execution performance for parallel computations, the Active Pages approach provides only limited benefit for improving the performance of the serial programs that are executed by typical users of home computers.

What is desired is an architecture for a multi-functional memory that provides benefit for the largest possible number of computer users. In particular, is it desirable to use a memory architecture that allows the memory in the semiconductor to test itself continuously, while simultaneously allowing the values in the memory to be accessed normally by the host processor without affecting the access time.

SUMMARY OF THE INVENTION

Provided is a multi-functional general purpose random access memory that is fabricated on a single semiconductor substrate. The substrate includes a memory array including a plurality of pages, one or more processing elements, and internal-external address mapping means. The pages, processing elements, and mapping means are connected to each other by clock, control, data, and address signal lines. The signal lines connect the processing elements and the internal-external mapping means to a host processor via an external access path, and signal lines connect the processing elements and the memory pages via a multi-function access path, and the signal lines connect the internal-external mapping means to the memory pages via in internal access path.

The memory also includes a plurality of spare pages with one processing element for each of the plurality of spare pages. The processing elements can be configured for continuous memory testing, memory filling, block transfer, string matching, and data compression while an external host processor concurrently accesses the memory for data reads and writes.

BRIEF DESCRIPTION OF THE DRAWINGS

FIG. 3 is a flow diagram of a multi-function memory according the invention.

DETAILED DESCRIPTION OF THE PREFERRED EMBODIMENT

Memory Structure

Figure 1:
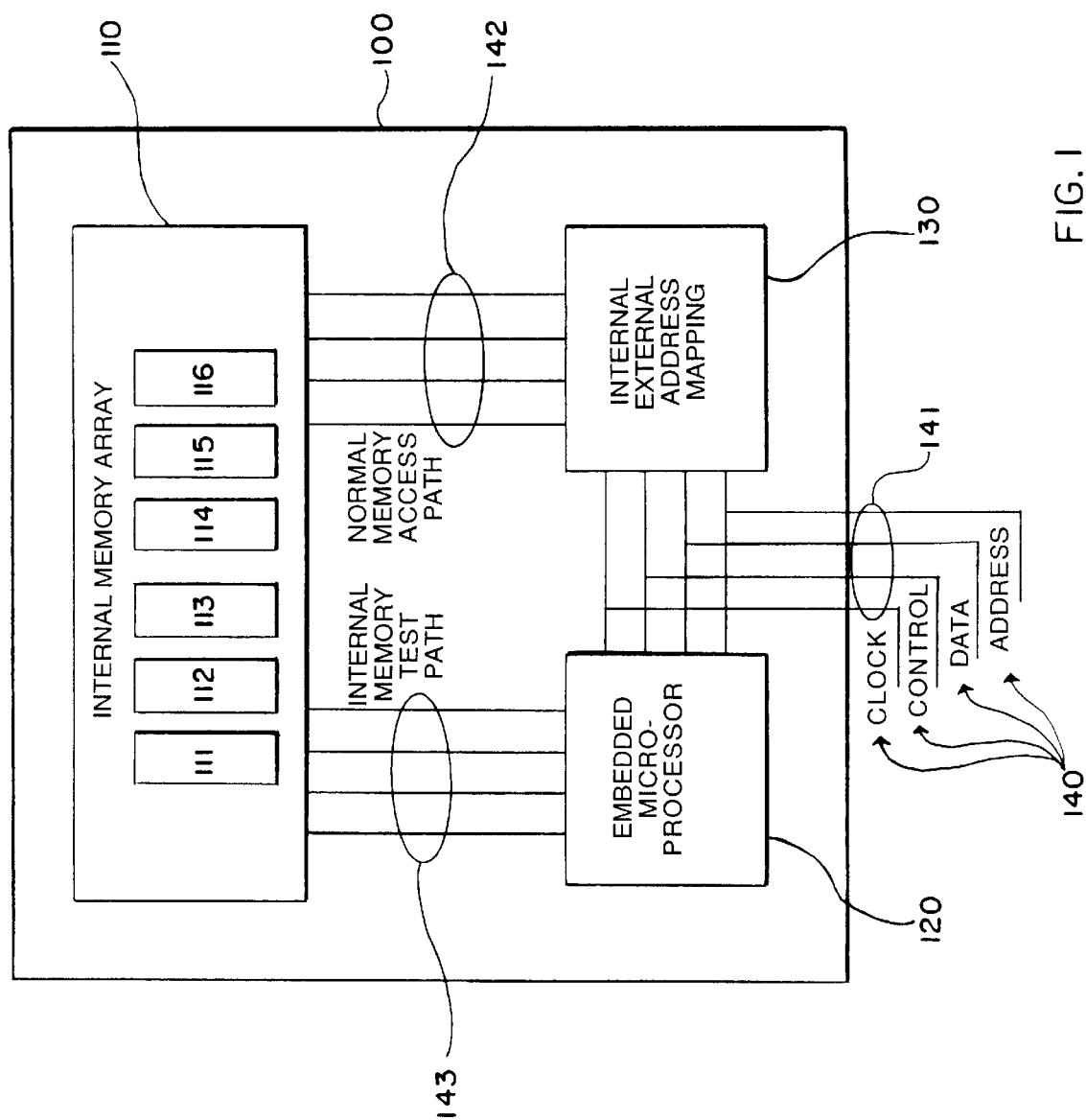
FIG. 1 is a block diagram of a self-testing memory according to the invention.

FIG. 1 shows a multi-functional dynamic random access memory (MFDRAM) 100 according to my invention. The MFDRAM 100 includes an internal memory array 110 of pages 111–116, an embedded processing element (PE) 120, and internal-external address mapping means 130 connected to each other by clock, control, data, and address signal lines 140 forming an external access path 141, and internal access path 142, and a test path 143.

Figure 2:
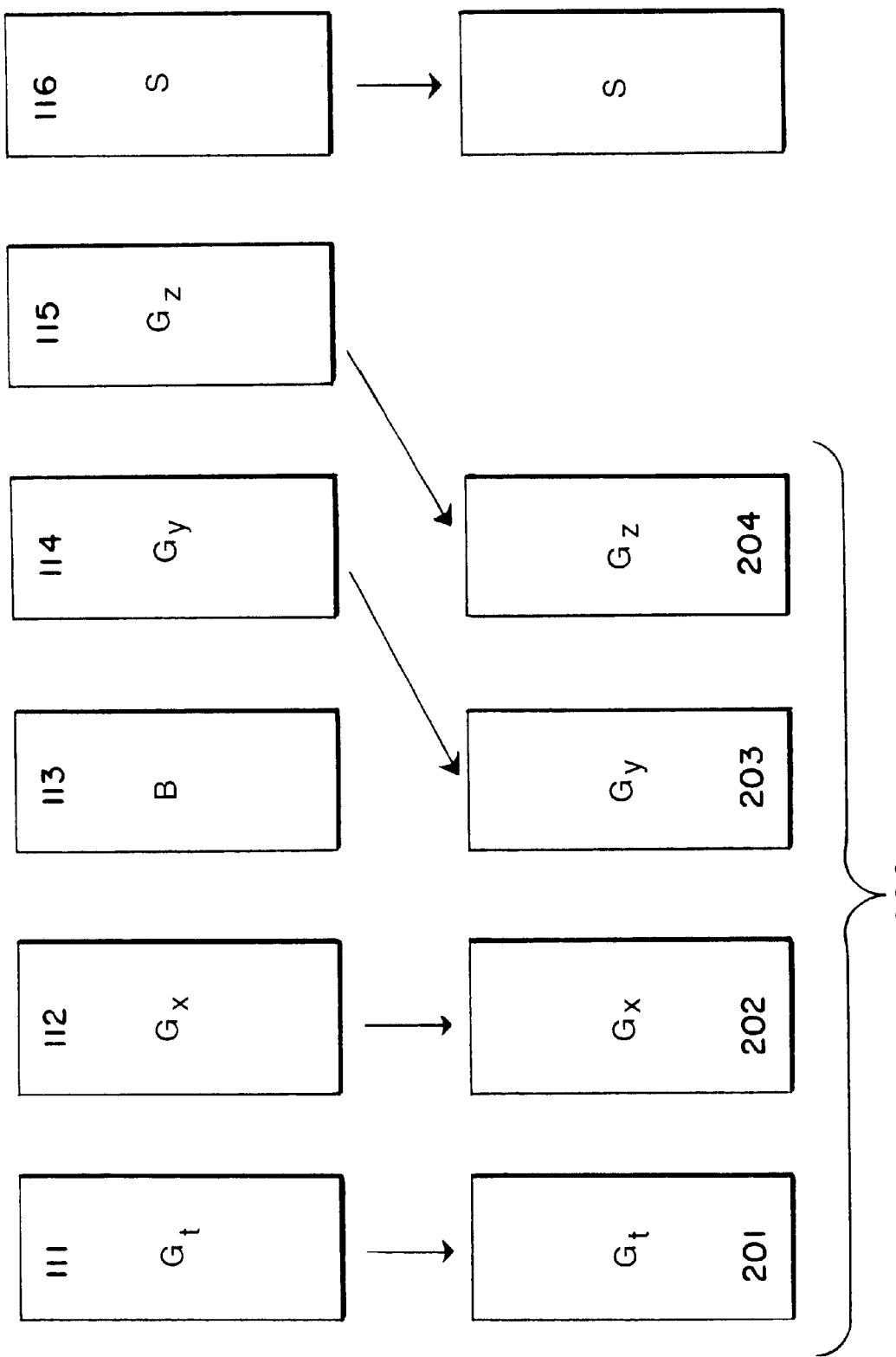
FIG. 2 is a block diagram of page mapping during memory testing.

As shown in FIG. 2, the pages 111–116 include "good" pages ($G_t$, $G_x$, $G_y$, $G_z$) 111, 112, 114, and 115, a "bad" page (B) 113, and a spare page (S) 116. Using page mapping, the good pages are mapped to the corresponding externally mapped pages 201–204. Only the mapped pages 200 are externally accessible via the lines 140 of the external path 141. In other words, the bad page and the spare page are normally not accessible to the host processor. The mapping means 130 is the mechanism that allows the internal-external mapping to be changed dynamically. The bad page 113 can be detected by the processing element 120, as described below.

To increase throughput, the memory 100 can include multiple processing elements 120. Associated with each processing element 120 are a separate set of memory pages, such as pages 111–116 and mapping means 130. Each processing element 120 functions independently from all other processing element instances as each contains its own private memory and mapping means.

The MFDRAM 100 can be configured as single semiconductor chips mounted on a Single In-line Memory Module (SIMM), or a Dual In-line Memory Module (DIMM). These modules use an industry standard form factor and electrical interface, and therefore can be inserted in any general purpose host computer system, such as, personal computers, laptops, workstations, and the like. Externally, the MFDRAM 100 is indistinguishable from standard mass produced main memory chips, such as DRAM, SRAM, SDRAM, RDRAM, etc.

MFDRAM Architecture

The multi-functional memory 100 as described herein is compatible with Intel's family of SDRAM architectures (PC100, PC133, etc.). Compliance is at the In-line Memory Module level. The chip 100 has a 32-bit data bus, not counting parity lines. The MFDRAM 100 can include 64 Mbits (8 MBytes) of DRAM, organized as 32×2M array. The MFDRAM module 100 includes a serial port to enable and disable its various functional modes described below.

When the MFDRAM 100 is in its default state, which is assumed when the MFDRAM is powered on, the MFDRAM appears to the host processor as a regular prior art DRAM chip. The host processor uses the serial interface to reconfigure the MFDRAM to be in a special mode that is not available to prior art DRAM chips. In this mode, called Host Access mode, there is a 4 KByte "hole" in the memory map that is not used to access DRAM locations, but rather to access the control and status registers of the internal processing element. These control and status registers make it possible for the host to download code to the processing element, and to cause the processing element to begin and halt execution, and to detect whether the processing element has signaled an interrupt or encountered an error condition. If the MFDRAM contains more than one processing element, then there are a plurality of 4 KByte address map holes, one per processing element.

Improving Memory Performance

As shown in FIG. 3, the MFDRAM 100 increases throughput for a number of application kernels 301–305, such as, memory testing, memory filling, block transferring, string matching, and data compression, as shown in FIG. 3. While the performance of host processors has been accelerating rapidly, these particular software kernels achieve comparatively little performance improvement due to their intrinsically poor data cache behavior. All of these application kernels involve iterating through linearly arranged data.

It is well known that with each successive generation of computer hardware, it takes increasingly more clock cycles to process a cache miss. The reason is that processor clock periods are quickly becoming increasingly shorter whereas DRAM access times have improved relatively more slowly. To deal with this gap in performance, processor caches have become increasingly larger, and increasingly more complicated to be as effective as in prior generations.

Caches are based on the principle of data locality. Two types of locality are exploited by caching: temporal and spatial. Temporal locality exploits the idea that when a memory location is accessed, it is very likely to be accessed again in the near future. Spatial locality exploits the notion that accessing a particular memory location is soon followed by accessing an adjacent location. For instance, if a memory location representing a pixel is accessed, it is likely for memory locations representing neighboring pixels to be subsequently accessed. There are two types of caches used by the host processor: the instruction cache (I-cache) that stores processor instructions and the data cache (D-cache) that stores data values. Every time the cache is accessed instead of the much slower DRAM, it speeds up the computation. In modern computer systems the goal is for cache hit-rates to be 95 per cent or greater; that is, only one access in twenty goes to slow DRAM.

With the MFDRAM 100, the program kernels 301–305 execute directly in the processing element of the MFDRAM chip. Memory values that are accessed during the execution of the on-chip processing element 120 are not transferred to the host processor or its cache memory. Under normal operation in which the D-cache hit-rates are high, it is expected that the host processor will be able to execute programs at up to ten times the rate of the on-chip processing element 120. However, for program kernels 301-305 that are characterized by low D-cache hit-rates, the opposite situation occurs, in which the on-chip processing element can execute such programs at up to ten times the rate of the external host processor. The speed of execution becomes limited by the time to access memory locations on the DRAM. In this case, the on-chip processor has the fastest access to the memory locations and thereby outperforms the host processor.

Memory Testing

In order to ensure reliable storage of data in a memory, the memory must periodically be tested. Most processors test memory immediately after power is turned on, before the bootstrap sequence is initiated. As the amount of memory increases with each successive generation of computer hardware, the memory test takes increasingly longer. The reason is that despite the continual, dramatic improvements in processor performance, and the continual, dramatic improvements in memory size, the time to access the entire memory becomes increasingly long. If the host processor is used to test memory, the D-cache must be disabled. Thus, the faster processors cannot execute the memory test any more rapidly than slower processors of prior generations.

Power-on memory test is an important function because a faulty memory invariably renders the entire computer useless. Memory failures are catastrophic and hard to diagnose. However, the power-on self test is visibly slow. On a typical personal computer equipped with a 300 MHz Intel processor, the self test proceeds at about 10 MBytes per second. In future generations of personal computers with multiple GBytes of memory, assuming no speed improvement in the DRAM, the memory test may take minutes.

Several types of memory tests can be performed. A simple test writes a constant value to each location in the memory, and then reads the data back and compares the value with the constant value that was written. To test whether the address lines are "stuck" or "shorted," it suffices to write the address of each location into the location and then to read back and compare with the address of the location.

To test for stuck or shorted data bits, a barber-pole pattern can be used. This is also known as walking-0's or walking-1's. A value that is all zeros, except for a single bit position which is a one, is written to location and read back and compared. The position of the one bit is moved to the next position and the test is repeated. The same test can then be repeated using a single zero bit with the rest of the bits set to one.

In the prior art, the testing of the memory is generally under the control of the processor. This is due to the fact that the memory is "dumb," i.e., the memory has no logic capability. With my invention, the memory tests itself, and memory testing can be continuous during operation of the host computer.

Some prior art DRAM chips contain self-test circuitry. However, in those implementations, the DRAM is disabled for normal data access while a memory test is executing. In other words, those memories either only access data or only test, not both concurrently as is the case here.

Memory Testing Operation

Generally, the self-testing of the memory operates as follows. To test a memory location in any of the good pages 111, 112, 114, 115, the on-chip processing element copies all the values from a particular good page to the spare page 116. The on-chip processing element 120 makes sure that the host processor has not made this page "dirty" during the copy operation. A page is dirty when the host processor writes over any of the values in the page being copied, and thereby creates an inconsistency between the good page and the spare page.

If the spare page 116 is "clean," then the host processor atomically changes the mapping function embodied in the mapping means 130. An atomic operation is one that is indivisible; an atomic update means that the entire operation is performed all at-once or not at all, so that the mapping means is never left in a partially-updated state at any time.

After the mapping is changed, the host processor can continue to read and write locations in the good page, but the actual values that are read and written now come from the spare page. Meanwhile, the processing element 120 runs the test program on the good page.

When the test completes and there is no anomaly discovered, then the mapping means 130 is reset back to its prior state so that accesses from the host processor go to the actual good page again.

If the spare page 116 became dirty during the memory test due to memory writes performed by the host processor, then the contents of the spare page 116 must be copied back to the good page before the mapping means 130 is updated. An atomic-update sequence is employed, similar to the one described above, to ensure that all of the modified locations in the good page are properly reflected.

Also note that in the process of performing the memory self-test, the memory being tested is refreshed as a side effect. In essence, the self-test circuitry completely eliminates the need for a separate memory refresh circuit.

Outline of MFDRAM Self-Test Computation

At power-on time, the host processor selects memory testing 301 on line 310, e.g. a control line. The select function configures the processing element 120 to perform memory testing. The program that performs a particular type of testing can be loaded via the data lines. An enable signal on line 311 initiates execution of the memory testing program. The processing element writes status information in locations of the memory array 110 indicating, for example, that the test program finished executing, and any additional information to signify errors.

The host processor polls these locations to determine completion. A hardware timer confirms that at the processing element 120 itself is working. If the test is successful, then the normal boot sequence can be initiated.

Host Access to Multi-Functional Memory

After power-on, the host processor accesses the locations of the MFDRAM 100 via the external path 141. From the perspective of the host, the memory 100 is fully compatible with prior art memories. During normal operation, the memory 100 is contiguous and fully populated, i.e., there are no address "holes."

The host controls the operating modes of the embedded microprocessor via the control line 310 which can be part of a standard serial I/O bus, such as USB. If this I/O bus is used to access all of the extra functionality of the MFDRAM, then full address space of the memory is always accessible to the host.

Alternatively, the I/O bus may be used only enable or disable the Host Access mode for the MFDRAM 100. This version permits faster access to the control and status registers via the memory bus; accesses via an I/O bus are much slower than accesses over the memory bus. When the MFDRAM 100 is in Host Access mode, a block of addresses becomes reserved for access to control and status registers, creating a "hole" in the address space of the memory. The memory locations at the reserved addresses become hidden while Host Access mode is enabled. That is, memory locations that are accessible by the host while Host Access mode is disabled cannot be accessed by the host when Host Access mode is enabled.

Other Memory Operations

In addition to performing self-testing 301, the embedded processing element 120 can also perform other frequently occurring and time consuming functions. They include memory filling 302, block transferring 303, string matching 304, and data compression 305.

Memory Fill With a Constant Value

Clearing memory is widely applicable for applications and the operating system alike. It is commonly performed when memory is allocated. Clearing memory is very easy to run in parallel when there is more than one processing element on the MFDRAM chip. This function requires as input an address 321, a constant 322, and a the number of locations to be filled 323. A typical constant value is zero.

Block Transferring

The MFDRAM 100 also accelerates block copies that stay on-chip. This function requires as input a first address 331, a second address 332, and the number of locations to be copied 333.

String Matching

String matching is a common operation involving two character strings: a potentially large string (the database), and a shorter string (the token). The objective is to determine if and where the token is contained completely within the database. String matching results in poor D-cache behavior when the database to be searched fits in DRAM but does not fit in the D-cache. This function requires as input a first address 341, a second address 342, and the size of the string 342.

Data Compression

A large number of contemporary applications use data compression, particularly multi-media applications on the World Wide Web that involve large data transfers of audio and video data. The potential increase in memory throughput is greatest for stream data where individual data frames are independently compressed or decompressed. This function requires as input an address 351, a size 352, and a compression function 353.

It is to be understood that various other adaptations and modifications may be made within the spirit and scope of the invention. Therefore, it is the object of the appended claims to cover all such variations and modifications as come within the true spirit and scope of the invention.

I claim:

1. A multi-functional general purpose random access memory fabricated on a single semiconductor substrate, comprising:

a memory array including a plurality of pages and a plurality of spare pages;

a plurality of processing elements, one for each of the plurality of spare pages;

an internal-external address mapping means; and clock, control, data, and address signal lines connecting the plurality of processing elements and the internal-external address mapping means to a host processor via an external access path, and the clock, control, data, and address signal lines connecting the plurality of processing elements and the memory pages via a multi-function access path, and the clock, control, data, and address signal lines connecting the internal-external mapping means to the memory pages via an internal access path.

2. The memory of claim 1 wherein the memory is mounted on a single in-line memory module.

3. The memory of claim 2 wherein the single in-line memory module includes an I/O port.

4. The memory of claim 1 wherein the memory is mounted on a dual in-line memory module.

5. The memory of claim 4 wherein the dual in-line memory module includes an I/O port.

6. The memory of claim 1 wherein the processing element for each of the plurality of spare pages is configured for continuous memory testing while the host processor is executing programs accessing the memory.

7. The memory of claim 1 wherein the processing element for each of the plurality of spare pages is configured for memory filling while the host processor is executing programs accessing the memory.

8. The memory of claim 1 wherein the processing element for each of the plurality of spare pages is configured for block transferring while the host processor is executing programs accessing the memory.

9. The memory of claim 1 wherein the processing element for each of the plurality of spare pages is configured for string matching while the host processor is executing programs accessing the memory.

10. The memory of claim 1 wherein the processing element for each of the plurality of spare pages is configured for data compression while the host processor is executing programs accessing the memory.

* * * * *